(12) United States Patent
Lai et al.

(10) Patent No.: US 8,283,571 B2
(45) Date of Patent: Oct. 9, 2012

(54) PRINTED CIRCUIT BOARD

(75) Inventors: Ying-Tso Lai, Taipei Hsien (TW);
Yung-Chieh Chen, Taipei Hsien (TW);
Chun-Jen Chen, Taipei Hsien (TW);
Wei-Chieh Chou, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 247 days.

(21) Appl. No.: 12/790,883

(22) Filed: May 31, 2010

(65) Prior Publication Data

US 2011/0284279 A1 Nov. 24, 2011

(30) Foreign Application Priority Data

May 20, 2010 (TW) .................................. 99116202 A

(51) Int. Cl.
*H05K 1/11* (2006.01)

(52) U.S. Cl. ........................................ 174/261; 174/250

(58) Field of Classification Search .......... 174/254–261;
361/777, 760, 780, 794–796; 333/5, 33, 333/238; 257/662, 664, 698; 29/847
See application file for complete search history.

(56) References Cited

U.S. PATENT DOCUMENTS

| 5,003,273 A | * | 3/1991 | Oppenberg ........................ 333/1 |
| 5,986,893 A | * | 11/1999 | Leigh et al. .................... 361/777 |
| 7,196,597 B2 | * | 3/2007 | Saitou et al. .................. 333/204 |
| 2005/0201072 A1 | * | 9/2005 | He et al. ........................ 361/794 |

* cited by examiner

*Primary Examiner* — Yuriy Semenenko
(74) *Attorney, Agent, or Firm* — Altis Law Group, Inc.

(57) ABSTRACT

A printed circuit board includes a signal layer, a dielectric layer, and a reference layer. The signal layer includes a pair of differential signal lines. The dielectric layer is sandwiched between the signal layer and the reference layer. A first void is defined in the reference layer between projections of the pair of differential signal lines. Two second voids are defined in the reference layer at opposite sides of the projections of the pair of differential signal lines.

2 Claims, 3 Drawing Sheets

PRINTED CIRCUIT BOARD

BACKGROUND

1. Technical Field

The present disclosure relates to a printed circuit board.

2. Description of Related Art

Nowadays, many printed circuit boards (PCBs) include differential signal lines arranged in signal layers of the printed circuit boards for connection to other components. For example, a common universal serial bus (USB) interface includes two data pins which are respectively and electrically connected to a pair of differential signal lines.

Referring to FIG. 1, a conventional PCB 100 includes a signal layer 110, a dielectric layer 120, and a reference layer 130. The signal layer 110 includes a pair of differential signal lines 112 and 114. The electric fields generated by the pair of differential signal lines 112 and 114 are not perpendicular to the reference layer 130 (see arrow area in the dielectric layer 120). If the reference layer 130 has some noise therein, the noise may easily be transferred to the pair of differential signal lines 112 and 114 through channels of the electric field, which may influence transmission quality of the pair of differential signal lines 112 and 114.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing in which like references indicate similar elements, is illustrated by way of example and not by way of limitation. It should be noted that references to "an" or "one" embodiment in this disclosure are not necessarily to the same embodiment, and such references mean at least one.

Figure 2:
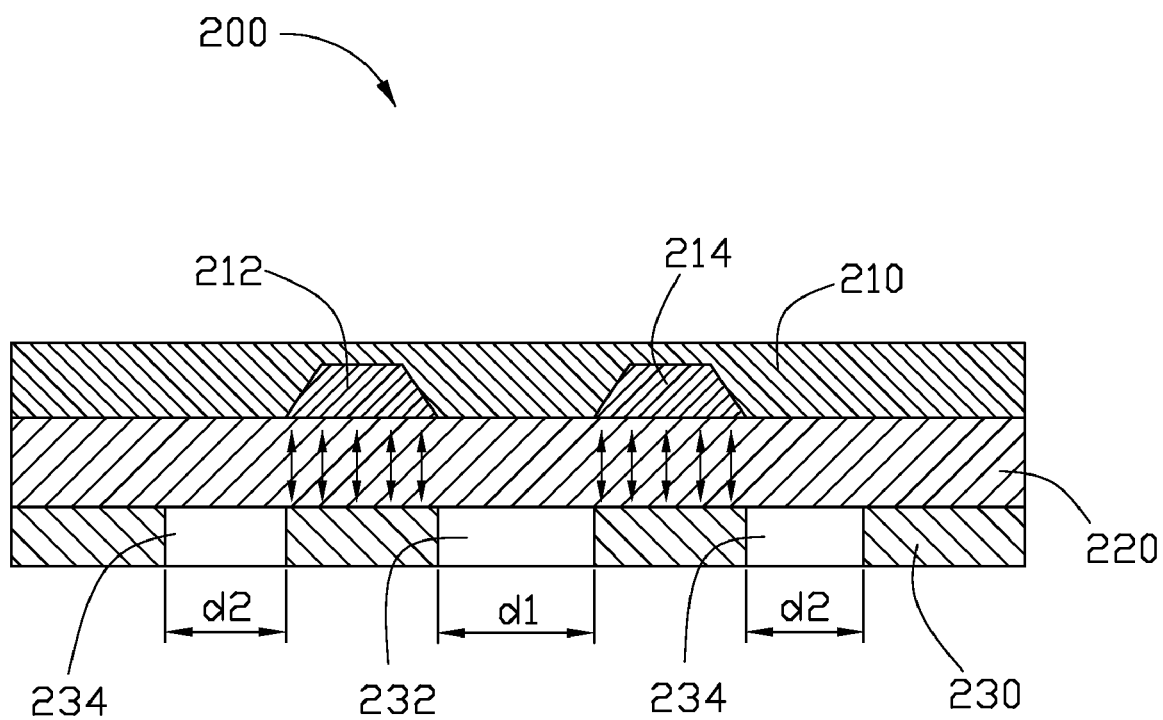
FIG. 2 is a cross-sectional view of an embodiment of a PCB.

Referring to FIG. 2, an embodiment of a printed circuit board (PCB) 200 includes a signal layer 210, a dielectric layer 220, and a reference layer 230. The dielectric layer 220 is sandwiched between the signal layer 210 and the reference layer 230. The signal layer 210 includes a pair of differential signal lines 212 and 214, for transmitting a pair of differential signals.

To avoid noise generated by the reference layer 230 influencing transmission quality of the pair of differential signal lines 212 and 214, a void 232 is defined in an area between the projections of the pair of differential signal lines 212 and 214 in the reference layer 230. Furthermore, two voids 234 are respectively defined at two sides of the projections of the pair of differential signal lines 212 and 214 in the reference layer 230. There is no void defined at the projections of the pair of differential signal lines 212 and 214 in the reference layer 230. A width d1 of the void 232 is equal to a distance between the differential signal lines 212 and 214. A width d2 of the void 234 can be designed according to simulation results. After forming the voids 232 and 234, the electric field generated by the pair of differential signal lines 212 and 214 are about perpendicular to the reference 230 (see arrow area in the dielectric layer 220). Therefore, the electric field is decreased, which can decrease influence from the noise generated by the reference layer 230.

The PCB 200 can be a PCB having a universal serial bus (USB) interface (not shown), and the USB interface includes two data pins which are respectively electrically connected to the pair of differential signal lines 212 and 214.

Figure 1:
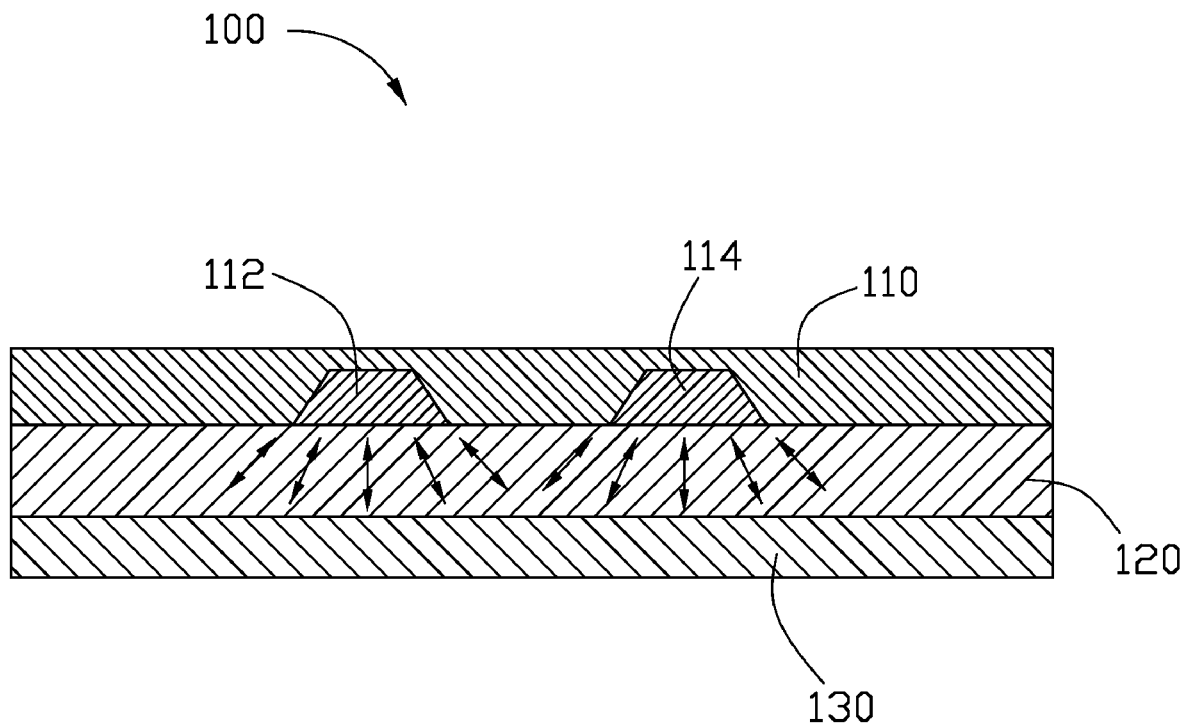
FIG. 1 is a cross-sectional view of a conventional printed circuit board (PCB).
Figure 3:
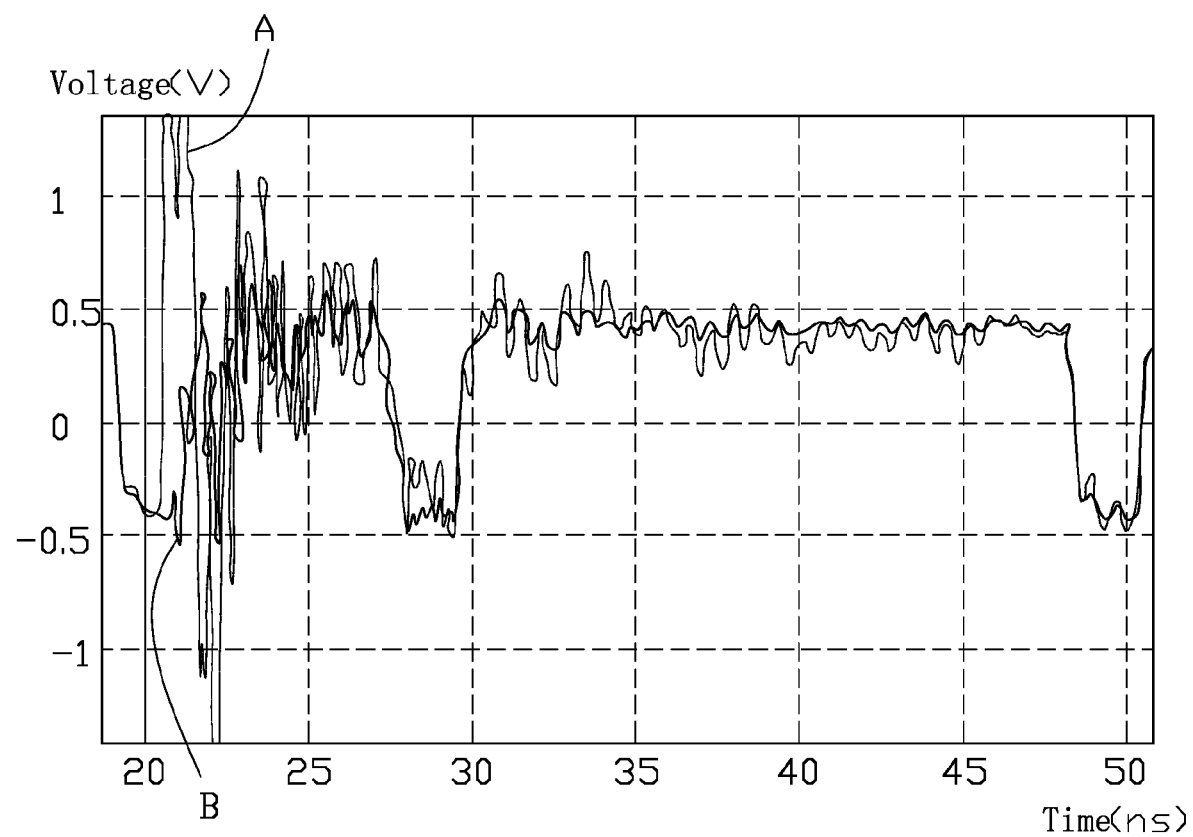
FIG. 3 is a graph of a computer generated simulation comparing the performance of the PCB of FIG. 1 with the performance of the PCB of FIG. 2.

Referring to FIG. 3, the curve A is a performance curve based on a simulation of transmission by the pair of differential signal lines 112 and 114 of FIG. 1, and the curve B is a performance curve based on a simulation of transmission of the pair of differential signal lines 212 and 214 of the embodiment. Obviously, the transmission quality of the pair of differential signal lines 212 and 214 is better than the transmission quality of the pair of differential signal lines 112 and 114.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
   a signal layer comprising a pair of differential signal lines;
   a dielectric layer; and
   a reference layer, wherein the dielectric layer is sandwiched between the signal layer and the reference layer, wherein a first void is defined in the reference layer between projections of the pair of differential signal lines, two second voids are defined in the reference layer at outer sides of the projections of the pair of differential signal lines, and no void is defined in the reference layer at the projections of the pair of differential signal lines.

2. The PCB of claim 1, wherein a width of the first void is equal to a width between the two differential signal lines.

\* \* \* \* \*